US008620252B2

(12) United States Patent
Rodal

(10) Patent No.: US 8,620,252 B2
(45) Date of Patent: *Dec. 31, 2013

(54) ULTRA LOW POWER, LOW NOISE SWITCHED CAPACITOR RADIO FREQUENCY MIXER

(75) Inventor: Eric Rodal, Gardnerville, NV (US)

(73) Assignee: Broadcom Corporation, Irvine, CA (US)

( * ) Notice: Subject to any disclaimer, the term of this patent is extended or adjusted under 35 U.S.C. 154(b) by 316 days.

This patent is subject to a terminal disclaimer.

(21) Appl. No.: 13/030,209

(22) Filed: Feb. 18, 2011

(65) Prior Publication Data

US 2012/0142301 A1    Jun. 7, 2012

Related U.S. Application Data

(63) Continuation-in-part of application No. 11/927,253, filed on Oct. 29, 2007, now Pat. No. 8,086,209.

(51) Int. Cl.
*H04B 1/10* (2006.01)

(52) U.S. Cl.
USPC .......................... 455/313; 455/318; 455/323

(58) Field of Classification Search
USPC ......... 455/130, 313, 314, 315, 317, 318, 323, 455/326, 330, 333
See application file for complete search history.

(56) References Cited

U.S. PATENT DOCUMENTS

2004/0063416 A1 * 4/2004 Kuenen et al. ................ 455/313
2007/0042744 A1 * 2/2007 Ali et al. ...................... 455/323

* cited by examiner

*Primary Examiner* — Thanh Le
(74) *Attorney, Agent, or Firm* — Garlick & Markison; Bruce E. Garlick

(57) ABSTRACT

Presented herein are systems, methods, and apparatus for ultra-low power, low noise switched capacitor radio frequency mixer. In one embodiment, there is described a method for mixing a signal. The method comprises mixing with a mixer, a received signal with a mixing signal to generate a mixed signal. The mixing signal comprises an in-phase component and an out-of-phase component and a desired frequency. The mixed signal comprises a mixed in-phase component and a mixed out-of-phase component. The method also comprises mixing one of the mixed in-phase component and the mixed out-of-phase component based on the mixing signal.

20 Claims, 5 Drawing Sheets

ULTRA LOW POWER, LOW NOISE SWITCHED CAPACITOR RADIO FREQUENCY MIXER

RELATED APPLICATIONS

This application is a continuation in part of "Method and Apparatus for Frequency Mixing of Radio Frequency Signals", U.S. application for patent Ser. No. 11/927,253 by Rodal, et al., filed Oct. 29, 2007, published as U.S. Pat. Pub. 2009/0111386, which is incorporated herein by reference.

BACKGROUND OF THE INVENTION

Increasing market penetration of wireless-communication or, simply, "wireless" devices, such as cellular telephones, radios, global-navigation-satellite-system (GNSS) receivers and the like, is generally premised on reducing costs associated with deployment of such devices while maintaining or improving performance and/or adding features thereto. One way to accomplish this task is to continually improve upon the components that perform electronic functions for wireless communications. For example, through continuous improvement of such components, newer generations of such wireless devices are routinely deployed in smaller packages with more processing power and lower power consumption, yet cost less than their earlier counterparts.

Further limitations and disadvantages of conventional and traditional approaches will become apparent to one of ordinary skill in the art through comparison of such systems with the present invention as set forth in the remainder of the present application with reference to the drawings.

BRIEF SUMMARY OF THE INVENTION

The present invention is directed to ultra low power, low noise switched capacitor radio frequency mixers, substantially as shown in and/or described in connection with at least one of the figures, as set forth more completely in the claims.

These and other advantages, aspects and novel features of the present invention, as well as details of illustrative aspects thereof, will be more fully understood from the following description and drawings.

DETAILED DESCRIPTION OF THE INVENTION

Described herein below are embodiments and other examples of a method and apparatus for frequency mixing of a radio-frequency (RF) signal, such as a satellite or cellular signal, to obtain two or more signals having phases in synchronism with respective phases of the RF signal (e.g., in-phase and quadrature components of the RF signal). These embodiments and other examples may be particularly useful for deployment in a receiver that is usable in a Global-Navigation-Satellite System (GNSS).

Those skilled in the art will appreciate that the method and apparatus may be used with various other types of mobile or wireless systems and devices. In addition, these wireless devices may be "location-enabled," and may be embodied as cellular telephones, pagers, laptop computers, personal digital assistants (PDAs), and like type wireless devices known in the art. Generally, location enabling the mobile devices may be facilitated by including within the devices a'capability of processing satellite signals of the GNSS ("GNSS satellite signals").

In addition, the details of the method and apparatus provided herein allow one skilled in the art to recognize that, as compared to conventional methods and apparatuses, one or more embodiments and other examples of the apparatus and/or devices that implement the method provide improved gain without having to increase power for consumption or current input to the apparatus or devices; and provide increased signal-to-noise ratios (SNRs) of signals output from the apparatus and/or the devices.

Figure 1:
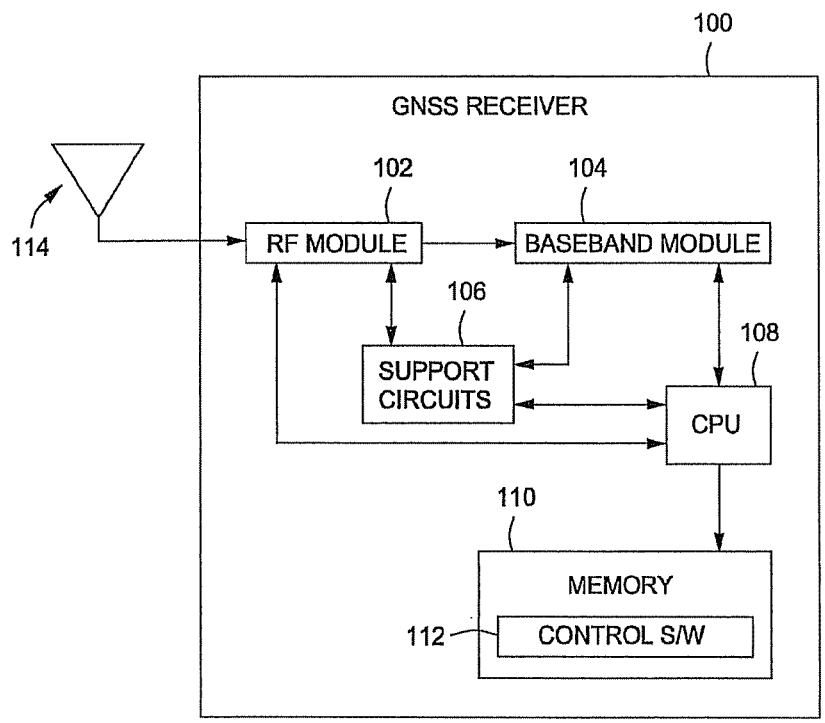
FIG. 1 is a block diagram of an exemplary GNSS receiver in accordance with an embodiment of the present invention.

Referring now to FIG. 1, there is illustrated a block diagram illustrating an exemplary GNSS receiver 100 in accordance with an embodiment of the present invention. The GNSS receiver 100 comprises a radio frequency (RF) module 102, a baseband module 104, support circuits 106, central processing unit (CPU) 108 and memory 110. The GNSS receiver 100 is typically coupled to an RF antenna 114 that is tuned to receive signals from at least one GNSS satellite. The RF module 102 processes the received RF signals to produce a baseband signal. The baseband signal is coupled to the baseband module 104 where the signals are further processed to extract information used to compute the position of the receiver 100.

The RF module 102 and the baseband module 104 are supported by support circuits 106 comprising oscillators, power supplies, clock circuits and the like. The CPU 108 performs control and computation functions by executing control software 112 that is stored in memory 110.

The GNSS receiver 100 may be implemented as a stand-alone receiver or as a component within a system or device. In one embodiment, the GNSS receiver 100 may be a component within a cellular telephone. In such an embodiment, the CPU 108, memory 110 and some support circuits 106 may be part of the cellular telephone. This configuration is known as a host-based configuration. Although the GNSS receiver 100 is described herein as one form of receiver that may benefit from the present invention, those skilled in the art will realize that other forms of receivers may likewise benefit from the present invention.

Figure 2:
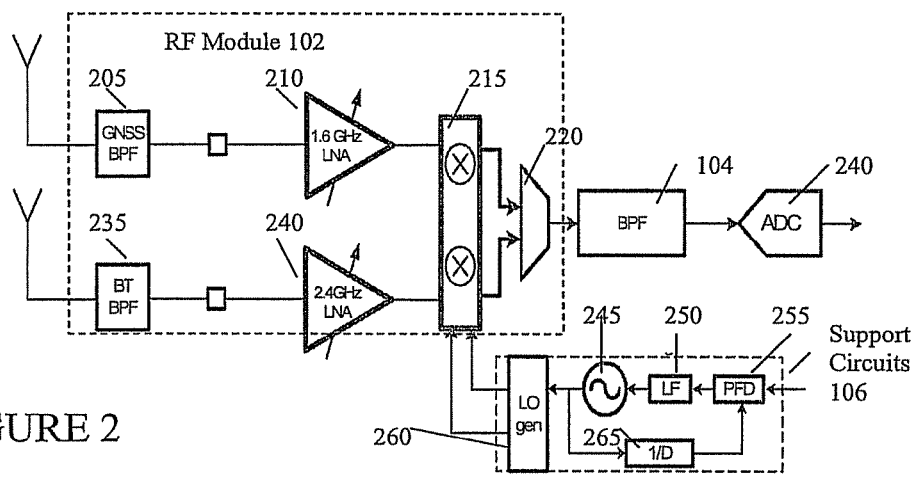
FIG. 2 is a block diagram of an exemplary radio frequency module in accordance with an embodiment of the present invention.

Referring now to FIG. 2 there is illustrated a block diagram of an exemplary radio frequency module 100 in accordance with an embodiment of the present invention. The radio frequency module 100 comprises a Global Navigation Satellite System (GNSS) portion and a Bluetooth® portion.

The GNSS portion comprises a GNSS band pass filter 205 and a GNSS Low Noise Amplifier 210. The Bluetooth portion comprises a Bluetooth Band Pass Filter 235 and Bluetooth Low Noise Amplifier 240. A capacitor switch mixer 215 mixes the outputs of a selectable one of the GNSS Low Noise Amplifier 210 and the Bluetooth Low Noise Amplifier 240 with a local oscillator generator 260

The IQ quadrature combiner 220 receives the outputs of the mixer 215 and provides a selection to a band pass filter 104. Alternatively, in certain embodiments, the I and Q channels could be carried all the way through the AD converter and then combined in the digital baseband section. The analog to digital converter (ADC) 240 digitizes the output of the band pass filter 104. The local oscillator generator 260 receives an output from a phase lock loop. The phase lock loop comprises an oscillator 245, a low pass filter 250, a phase detector 255, and a divider 265.

The mixer 215 mixes the incoming radio signal with a frequency signal having the desired frequency. A square wave signal of the desired frequency with a 50% duty cycle has the following equation:

$$x_{square}(t) = \frac{4}{\pi} \sum_{k=1}^{\infty} \frac{\sin((2k-1)2\pi f t)}{(2k-1)}$$
$$= \frac{4}{\pi} \left( \sin(2\pi f t) + \frac{1}{3}\sin(6\pi f t) + \frac{1}{5}\sin(10\pi f t) + \ldots \right).$$

The equation, in addition to frequency f, also includes frequency components $3f, 5f, 7f \ldots$. The additional frequency components $3f, 5f, 7f,$ comprise approximately 15% of the total energy of the signal.

Figure 3:
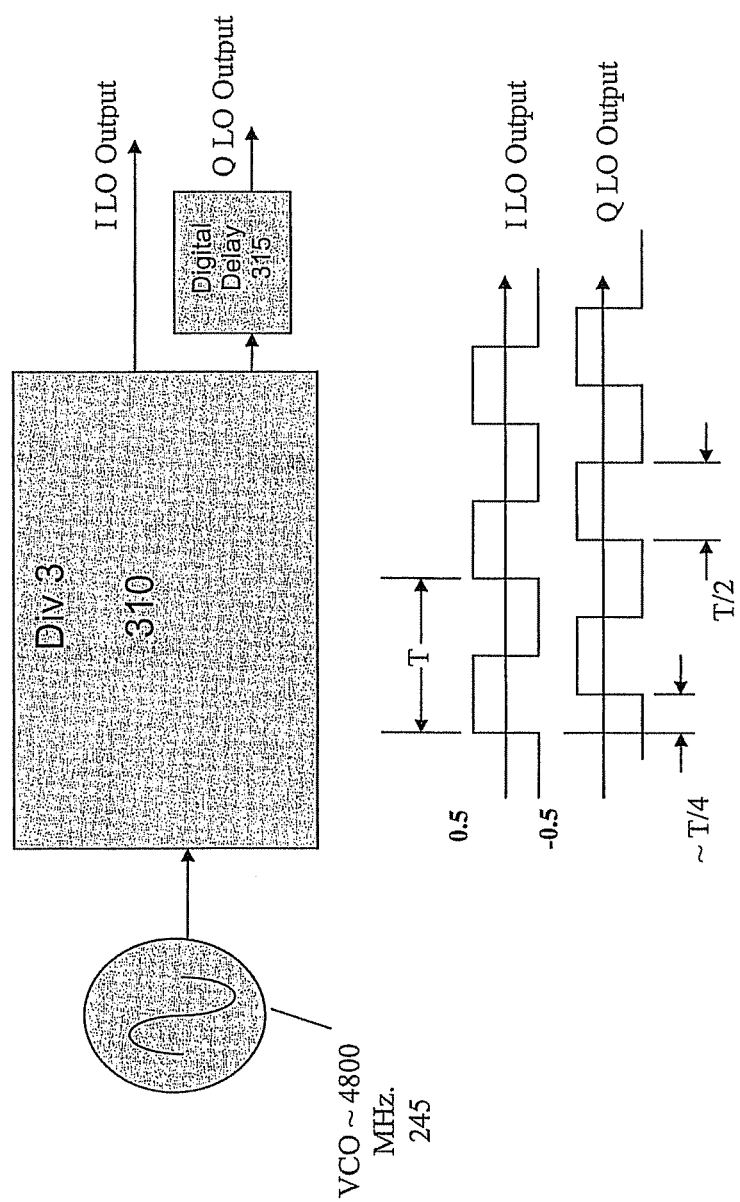
FIG. 3 is a block diagram of an exemplary local oscillator generator in accordance with an embodiment of the present invention.

Referring now to FIG. 3, there is illustrated a block diagram of an exemplary local oscillator generator in accordance with an embodiment of the present invention. The local oscillator generator receives the output of the voltage-controlled oscillator 245 in the phase lock loop (PLL). The voltage-controlled oscillator 245 provides a 4800 MHz signal to a divider 310.

The divider 310 divides the signal by three for GNSS applications, resulting in a 1600 MHz signal, or divides the signal by two for Bluetooth applications, resulting in a 2400 MHz signal. The divider 310 provides an in-phase (I) 1600/2400 MHz square wave signal with a 50% duty cycle. The divider 310 also provides the output to a digital delay 315. The digital delay also phase delays the output signal with a 30-degree offset, thereby resulting in an 90-degree out-of-phase signal (Q).

Figure 4:
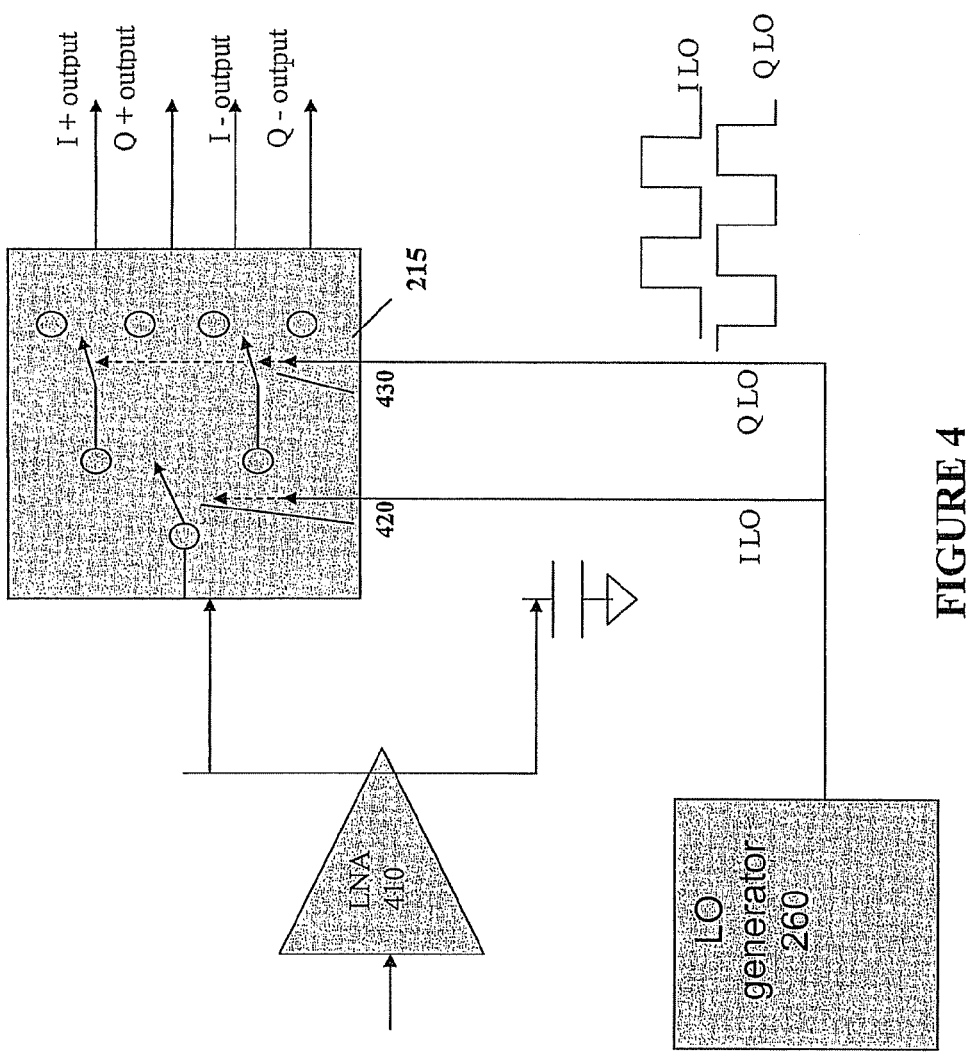
FIG. 4 is a block diagram of an exemplary switched capacitor mixer in accordance with an embodiment of the present invention.

FIG. 4 is a block diagram of an exemplary switched capacitor mixer 215 in accordance with an embodiment of the present invention. The switched capacitor mixer 215 receives the output of the low noise amplifier 410 and the in-phase local oscillator generator signal I LO and out-of-phase local oscillator generator signal Q LO from the local generator 260. The switched capacitor comprises cascaded switches 420 and 430.

The I LO signal controls switch 420, establishing connection between a first node and a second node. Each node is connected to second switches 430. The second switches are controlled by the Q LO signal. As a result, the output of the switched capacitor mixer 215 is controlled by the combination of values of the I LO signal and the Q LO signals resulting in one of four different output states.

The four different states comprise the in-phase positive, I+, out-of-phase positive Q+, in-phase negative I−, and out-of-phase Q−. When both I LO and Q LO are high, the switch 420 outputs the in-phase portion I+ of the radio signal at the desired frequency. When the I LO is high and Q LO is low, the switch 420 outputs the out-of-phase portion Q+ of the radio signal at the desired frequency. When the I LO is low and Q LO is high, the switch 420 outputs the inverse of the in-phase component I− of the radio signal at the desired frequency.

When both I LO and Q LO are low, the switch 420 outputs the inverse out-of-phase portion Q− of the radio signal at the desired frequency.

FIG. 4 includes a switched capacitor mixer 215 in accordance with an embodiment of the present invention. The switched capacitor mixer 215 receives the output of the low noise amplifier 410 and signals ILOp, QLOp, ILOn, and QLOn from the local oscillator.

The capacitor mixer comprises two columns of four switches. The signals ILOp, QLOp, ILOn, and QLOn each control one of the switches in the column. The output of the switches controlled by ILOp and QLOp is I+ output. The output of the switches controlled by QLOn and ILOp is Q+ output. The output of the switches controlled by ILOn and QLOn is I− output. The output of the switches controlled by QLOp and ILOn is Q− output.

Figure 5:
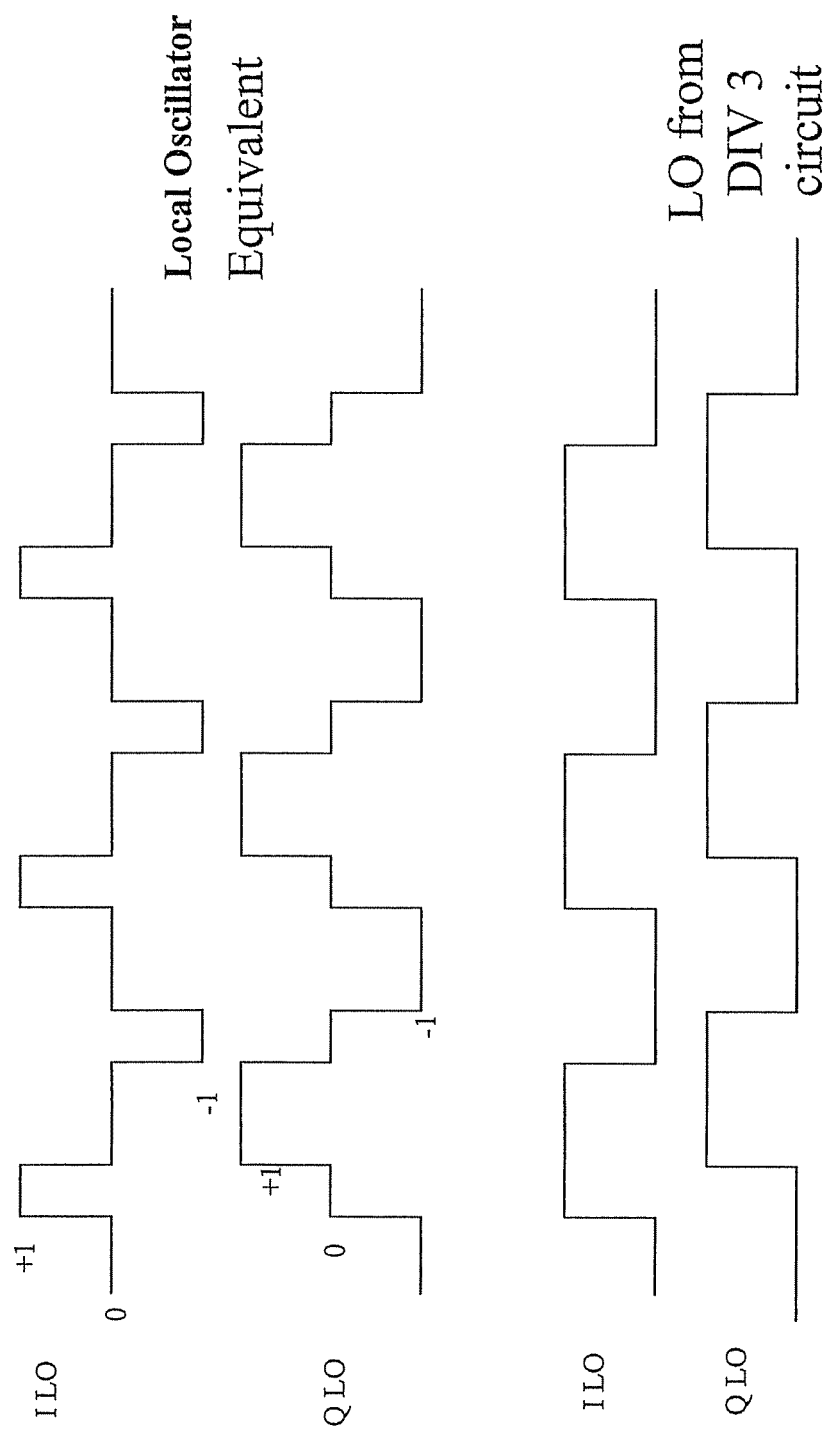
FIG. 5 is a block diagram describing the outputs of the local oscillator and the mixer in accordance with an embodiment of the present invention.

Connecting the switches in this configuration allows for a conventional LO to be used. The conventional LO is simple to realize, thus lowering the overall system power. By connecting one of the outputs of the differential LNA to the capacitor and the other to the mixer, the mixer can act as a balun. The mixer then has only one input, reducing the number of switches required and increasing the gain Referring now to FIG. 5 is a block diagram describing the outputs of the local oscillator and the local oscillator equivalent in accordance with an embodiment of the present invention. The in-phase local oscillator equivalent is the difference of the in-phase I LO and the out-of-phase Q LO signals. The out-of-phase local oscillator equivalent is the sum of in-phase I LO and the out-of-phase Q LO signals.

Digital delay 315 can be used to substantially improve the equivalent waveforms. Also while the waveforms in FIG. 5 are not identical to each other, perfect quadrature is maintained.

Figure 6:
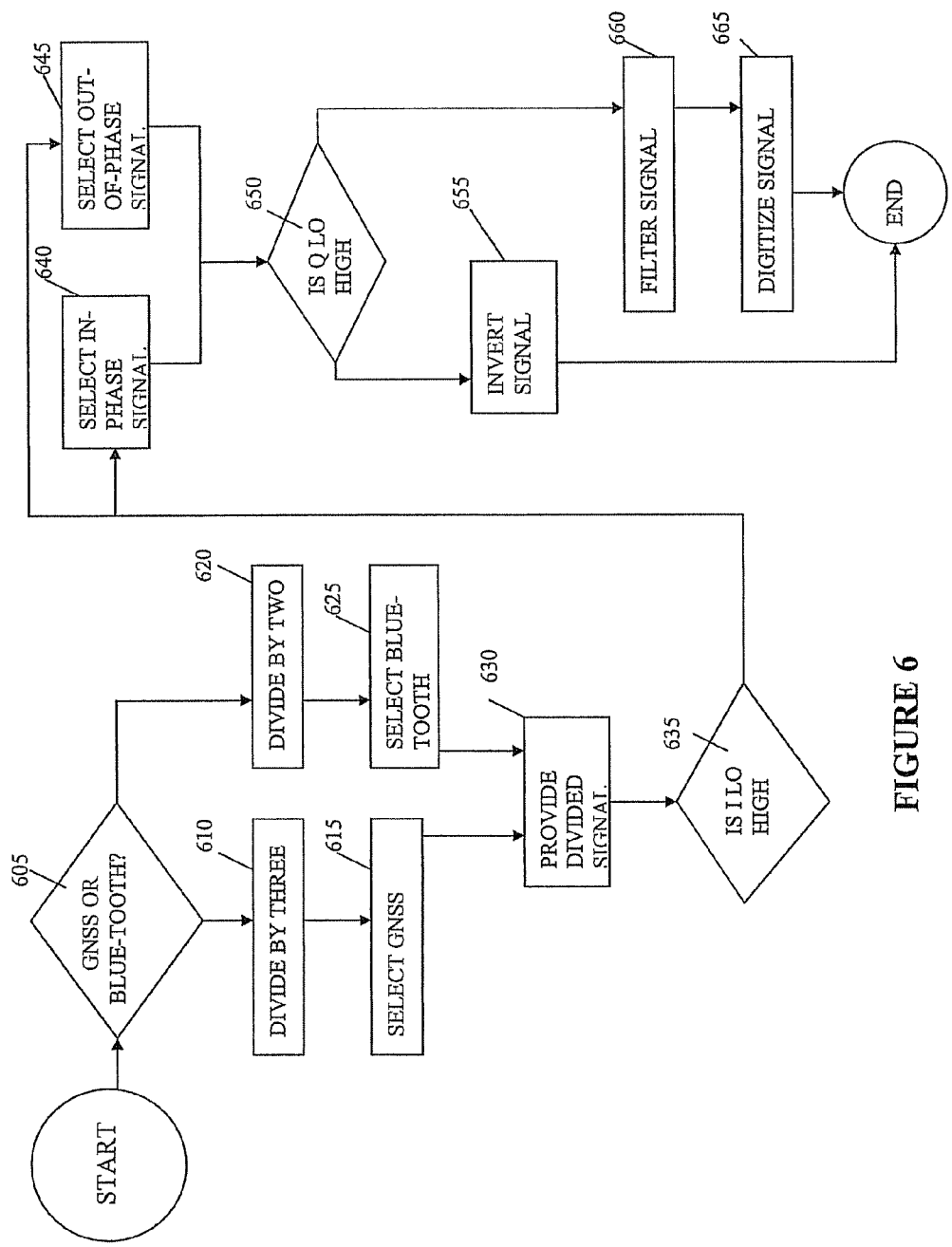
FIG. 6 is a flow diagram for mixing a radio frequency signal in accordance with an embodiment of the present invention.

Referring now to FIG. 6, there is illustrated a flow diagram describing a method for mixing a radio frequency signal in accordance with an embodiment of the present invention. The flow diagram will be described in connection with FIGS. 1-4.

At 605, the CPU 108 provides a selection of one of Bluetooth or GNSS signal to receive. If the selection is GNSS, the local oscillator generator 260 divides by three (610), and the switch capacitor mixer 215 selects (615) the GNSS signal from the switch capacitor mixer 215. If the selection is Bluetooth, the local oscillator generator 260 divides by two (620) and the switch capacitor mixer 215 selects (625) the Bluetooth signal from the switch capacitor mixer 215.

At 630, the local oscillator 260 divides a 4800 MHz signal and provides an in-phase I LO and out-of-phase Q LO (635) to the switch capacitor mixer 215. Based on whether the in-phase I LO signal is high or low (640), the mixer 215 selects (645) the in-phase signal (I LO=high) of the radio I at the desired frequency or the out-of-phase signal Q of the radio at the desired frequency (I LO=low) (650).

Based on whether the out-of-phase Q LO signal is high or low, the mixer 215 provides (655) the signal selected at 645 or 650, or inverts the signal selected at 645 or 650 (655). At 660, the band pass filter 104 filters the signal provided at 655. The ADC 240 digitizes the output of the band pass filter 104 at 665.

The embodiments described herein may be implemented as a board level product, as a single chip, application specific integrated circuit (ASIC), or with varying levels of the system integrated with other portions of the system as separate components. Alternatively, certain aspects of the present invention are implemented as firmware. The degree of integration may primarily be determined by the speed and cost considerations.

While the present invention has been described with reference to certain embodiments, it will be understood by those skilled in the art that various changes may be made and equivalents may be substituted without departing from the scope of the present invention.

Therefore, it is intended that the present invention not be limited to the particular embodiment disclosed, but that the present invention will include all embodiments falling within the scope of the appended claims and equivalents thereof.

The invention claimed is:

1. A method for mixing a signal, said method comprising:
   mixing with a mixer, a received signal with a mixing signal, said mixing signal comprising an in-phase component and an out-of-phase component and having a desired frequency, to generate a mixed signal, said mixed signal comprising a mixed in-phase component and a mixed out-of-phase component; and
   selecting one of the mixed in-phase component and the mixed out-of-phase component based on the mixing signal.

2. The method of claim 1, wherein selecting further comprises:
   selecting the mixed in-phase component or mixed out-of-phase component based on the state of the in-phase component of the mixing signal.

3. The method of claim 2, wherein selecting further comprises:
   selecting the mixed in-phase component if the in-phase component of the mixing signal is in a high state; and
   selecting the mixed out-of-phase component if the in-phase component of the mixing signal is in a low state.

4. The method of claim 1, wherein selecting further comprises:
   inverting a selected signal at the mixer based on the state of the mixing out-of-phase component.

5. The method of claim 4, wherein inverting further comprises:
   inverting the selected if the out-of-phase component of the mixing signal is in a low state.

6. The method of claim 1, wherein mixing further comprises:
   dividing a frequency signal by a particular amount, thereby resulting in the in-phase component of the mixing signal;
   delaying the in-phase component of the mixing signal, thereby resulting in the out-of-phase component.

7. The method of claim 6, wherein delaying comprises:
   delaying the in-phase component by approximately 30 degrees.

8. A receiver for mixing a signal, said method comprising:
   a mixer for mixing a received signal with a mixing signal, said mixing signal comprising an in-phase component and an out-of-phase component and having a desired frequency, to generate a mixed signal, said mixed signal comprising a mixed in-phase component and a mixed out-of-phase component; and
   wherein said mixer comprising a first switch for selecting one of the mixed in-phase component and the mixed out-of-phase component based on the mixing signal.

9. The receiver of claim 8, wherein the first switch selects the mixed in-phase component or mixed out-of-phase component based on the state of the in-phase component of the mixing signal.

10. The receiver of claim 9, wherein the switch selects the mixed in-phase component if the in-phase component of the mixing signal is in a high state and selects the mixed out-of-phase component if the in-phase component of the mixing signal is in a low state.

11. The receiver of claim 10, wherein the mixer further comprises a second switch for selecting an inverted selected signal at the mixer based on the state of the mixing out-of-phase component if the out-of-phase component of the mixing signal is in a low state.

12. The receiver of claim 8, further comprising:
    a divider for dividing a frequency signal by a particular amount, thereby resulting in the in-phase component of the mixing signal;
    a delay for delaying the in-phase component of the mixing signal, thereby resulting in the out-of-phase component.

13. The receiver of claim 12, wherein the delay delays the in-phase component by approximately 30 degrees.

14. A receiver for mixing a signal, said method comprising:
    a mixer operable to mix a received signal with a mixing signal, said mixing signal comprising an in-phase component and an out-of-phase component and having a desired frequency, to generate a mixed signal, said mixed signal comprising a mixed in-phase component and a mixed out-of-phase component; and
    wherein said mixer comprising a first switch operable to select one of the mixed in-phase component and the mixed out-of-phase component based on the mixing signal.

15. The receiver of claim 14, wherein the first switch is operable to select the mixed in-phase component or mixed out-of-phase component based on the state of the in-phase component of the mixing signal.

16. The receiver of claim 15, wherein the first switch is operable to select the mixed in-phase component if the in-phase component of the mixing signal is in a high state and select the mixed out-of-phase component if the in-phase component of the mixing signal is in a low state.

17. The receiver of claim 16, wherein the mixer further comprises a second switch for selecting an inverted selected signal at the mixer based on the state of the mixing out-of-phase component if the out-of-phase component of the mixing signal is in a low state.

18. The receiver of claim 15, further comprising:
    a divider electrically coupled to the mixer to divide a frequency signal by a particular amount, thereby resulting in the in-phase component of the mixing signal;
    a delay electrically coupled to the divider to delay the in-phase component of the mixing signal, thereby resulting in the out-of-phase component.

19. The receiver of claim 18, wherein the delay delays the in-phase component by approximately 30 degrees.

20. The receiver of claim 18, further comprising a controller for selecting the particular amount that the divider divides the frequency signal.

* * * * *

UNITED STATES PATENT AND TRADEMARK OFFICE
CERTIFICATE OF CORRECTION

Page 1 of 1

PATENT NO. : 8,620,252 B2
APPLICATION NO. : 13/030209
DATED : December 31, 2013
INVENTOR(S) : Eric Rodal It is certified that error appears in the above-identified patent and that said Letters Patent is hereby corrected as shown below:

In the Claims

Col. 5, line 39, in claim 5: after "the selected" insert --signal--

Signed and Sealed this
Second Day of September, 2014

Michelle K. Lee
*Deputy Director of the United States Patent and Trademark Office*